United States Patent [19]

Dick

[11] Patent Number: 4,757,278

[45] Date of Patent: Jul. 12, 1988

[54] LOW NOISE CRYOGENIC DIELECTRIC RESONATOR OSCILLATOR

[75] Inventor: G. John Dick, Pasadena, Calif.

[73] Assignee: The United States of America as represented by the Administrator of the National Aeronautics and Space Administration, Washington, D.C.

[21] Appl. No.: 116,810

[22] Filed: Nov. 5, 1987

[51] Int. Cl.[4] .................................. H03L 7/26
[52] U.S. Cl. ........................... 331/3; 331/94.1; 331/162
[58] Field of Search ............. 331/3, 69, 94.1, 158, 331/162; 332/7.5; 333/219

[56] References Cited

U.S. PATENT DOCUMENTS 4,242,611  12/1980  Douglass ............... 331/162 X
4,488,124  12/1984  Yoshimura ............. 331/107 DP
4,495,478  1/1985   Kwon et al. ........... 333/230

Primary Examiner—Eugene R. LaRoche
Assistant Examiner—David Mis
Attorney, Agent, or Firm—Paul F. McCaul; John R. Manning; Thomas H. Jones

[57] ABSTRACT

A microwave oscillator is provided which can operate at a temperature of many degrees above absolute zero while providing very low phase noise that has heretofore generally required temperatures within a few degrees K. The oscillator includes a ring-shaped resonator element of ruby (sapphire plus chromium) or iron sapphire crystal, lying adjacent to a resonator element of sapphire, so the regenerator element lies directly in the magnetic field of the resonator element. The resonator element is substantially devoid of contact with electrically conductive material. Microwave energy of a pump frequency (e.g. 31GHz) is applied to the regenerator element, while signal energy (e.g. 10GHz) is outputted from the resonator element.

11 Claims, 1 Drawing Sheet

LOW NOISE CRYOGENIC DIELECTRIC RESONATOR OSCILLATOR

ORIGIN OF THE INVENTION

The invention described herein was made in the performance of work under a NASA contract, and is subject to the provisions of Public Law 96-517 (35 USC 202) in which the Contractor has elected not to retain title.

BACKGROUND OF THE INVENTION

Microwave local oscillators with very low phase noise are used in various radar, communications and radiometric applications. Moderately low noise at frequency offsets of less than 1 kHz is conventionally obtained by locking a microwave oscillator to the multiplied frequency of a (e.g. 5 to 10 MHz) quartz crystal oscillator. Very low noise has been obtained by using superconducting cavities, one design using an oscillator element formed solely of superconducting material, and another using a sapphire core coated with superconducting material. Because penetration depth varies with temperature for superconductors, these oscillators require temperatures of no more than about 1° to 2° K. Such very low temperatures require large and expensive cooling equipment. A very low phase noise oscillator which could operate at temperatures of at least about 10° K. and higher, which is obtainable by available relatively small and economical cryogenic coolers, would be of considerable value.

SUMMARY OF THE INVENTION

In accordance with one embodiment of the present invention, a very low noise microwave oscillator is provided, which can operate at temperatures of many degrees K above absolute zero. The oscillator includes a regenerator element that is resonant to a predetermined pump frequency, and a resonator element that is resonant to a predetermined signal frequency that is different from the pump frequency. Both elements are formed of dielectric material, and are preferably devoid of contact with electrically conductive material that could degrade their performance when such material is not at a low superconducting temperature. Both elements are preferrably formed primarily of crystalline aluminum oxide (sapphire), with the regenerator element formed of ruby (aluminum oxide plus chromium) or iron sapphire, and the resonator element formed of sapphire.

In one oscillator, the resonator includes primarily a ring-shaped portion for oscillation, and also includes a thin disc-shaped portion within the ring portion for support. The resonator includes two ring-shaped portions lying on opposite faces of the disc portion of the resonator. This arrangement is gravitationally symmetrical, so its operation is independent of its orientation.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
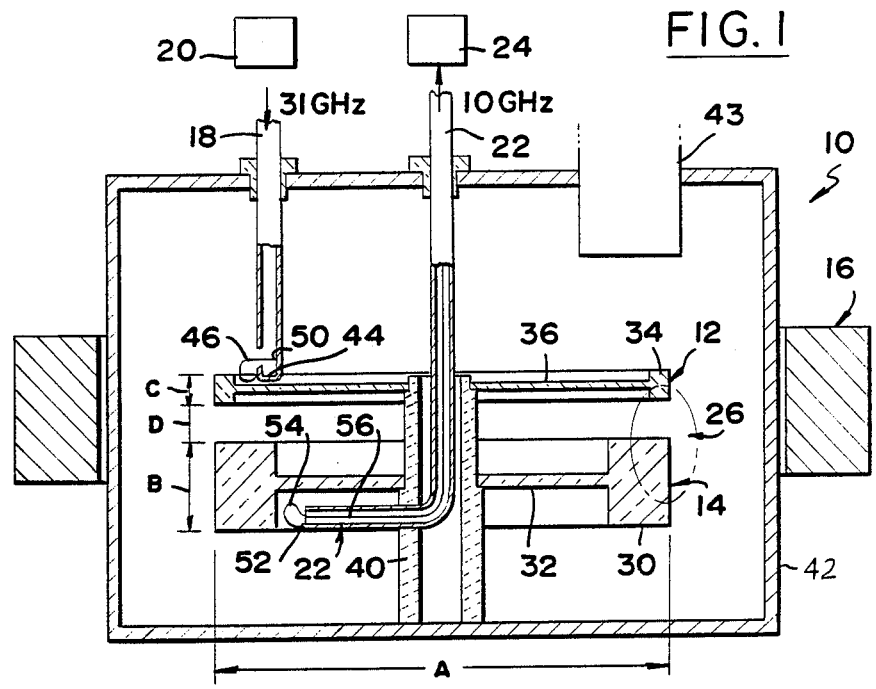
FIG. 1 is a sectional view of a low noise oscillator constructed in accodance with the present invention.

FIG. 1 illustrates a low phase noise oscillator 10 of the present invention, which includes a regenerator element 12 formed of a maser material such as ruby (crystalline aluminum oxide plus about 0.05% chromium) and a resonator element 14 of maser material such as sapphire (crystalline aluminum oxide). The ruby regenerator element 12, which is sometimes referred to as a resonator, oscillates at a predetermined frequency such as 31 GHz (gigahertz) when in the presence of a strong magnetic field. A magnet at 16 is provided to generate a magnetic field of about 1K to 5 kGauss. The resonator element 14 is formed to resonate at a predetermined signal frequency such as 10 GHz. A feed line 18 applies pump power in the form of electromagnetic radiation of about 31 GHz at a power of about 100 microwatts at 10° K. (ten times the power required at 1° K.) from a pump source 20 such as a room temperature oscillator, to the regenrator element 12. An output line 22 carries signal power from the resonator element 14 to a signal output terminal 24. Either waveguides or coaxial cables can be used for each line 18, 22, although applicant shows a waveguide for the feed line 18 and a coaxial cable for the output line 22.

In the past, low nose oscillators of a type which included a regenerator element to which pump power was applied, and a resonator element which oscillated at the desired signal frequency, kept these elements a considerable distance apart. The regenerator was typically formed of ruby, which requires a high magnetic field to resonate. The resonator element was formed partially or wholly of superconducting material, to which a magnetic field is deliterious. Also, the superconducting material had to be maintained at a temperature no more than about 1.5° K. in order to obtain sufficient stability of its penetration depth for effective operation. A long narrow coupling device such as a coaxial cable coupled the regenerator element to the resonator element. Such long coupling can reduce the Q (quality factor) of the ruby from −1000 to −1500, in addition to increasing the bulk of the apparatus portion that must be maintained at a low cryogenic temperature.

In the oscillator of FIG. 1, the resonator element 14 is formed entirely of dielectric material, preferably sapphire. The sapphire resonator element is not affected by the magnetic field, and can be placed close to the ruby regenerator element 12, which enables close direct coupling of the elements. The resonator element 14 is placed close enough to the regenerator element 12, that the regenerator element lies within the microwave magnetic fringing fields, indicated at 26, of the resonator element. This avoids the need for a coaxial line or other indirect coupling between the elements.

The use of a sapphire resonator 14, which is substantially devoid of contact with electrically conductive material, has two advantages. One advantage is that the resonator element is not affected by a magnetic field, as is superconductive material, so that the resonator 14 can lie cloesly adjacent to the regenerator element 12, even when the regenerator element is a ruby which requires a magnetic field to provide regenerative power. Another advantage is that the Q of the elements is not degraded by the presence of electrically conductive material that is not superconductive or by superconductive material that is not at a low superconductive temperature.

The gain or absolute magnitude of the inverse of the negative Q of a ruby regenerator varies inversely with temperature; at 4° K. the Q may be about −400, and at 20° K. may be about −2000. In order to generate a signal output, the absolute value of the regenerator element negative Q, in the presence of losses due to surrounding conductive material, must be smaller than the absolute value of the resonator element positive Q multiplied by a coupling fraction. This coupling fraction is the fraction of resonator energy which, through the fringing fields, effectively penetrates the regenerator element. This coupling fraction may be of the order of $10^{-5}$. The Q of the sapphire resonator may be about $10^9$ so that oscillation can occur so long as, for one example, the product $10^9 \times 10^{-5}$ (Q times coupling fraction) is greater than the absolute value of the effective Q of the ruby regenerator element.

By adjusting the proximity of the resonator and regenerator elements, the coupling fraction may be varied to optimize oscillator performance. If the elements are spaced too far apart so not enough regenerator element material lies in the intense magnetic fringe field of the resonator element, the coupling fraction will be too small and oscillation cannot occur. If the elements are too close together, the coupling fraction will be too large and the influence of instabilities in the regenerator on the operating frequency is too large, and the high Q of the sapphire resonator is largely wasted. The optimum spacing is the greatest that still allows oscillation (for maximum oscillator stability). The spacing between elements is generally less than the radius of the larger of the elements, to allow oscillation. By minimizing the amount of conductive material immediately about the elements, the absolute value of the effective Q of the ruby regenerator can be maintained low enough to enable oscillations to occur at temperatures above 10° K.

In one oscillator that applicant has designed, the regenerator and resonator elements 12, 14 each had a diameter A of about 5 cm. The resonator element 14 had a thickness B of 1 cm while the regenerator element 12 had a thickness C of about 0.3 cm. The resonator element 14 is formed with a ring-shaped portion 30 constituting most of the volume of the element, and also includes a disc-shaped portion 32 lying within the ring portion to facilitate support of the element. Similarly, the regenerator element includes a ring-shaped portion 34 and a thinner disc-shaped portion 36. The two elements 12,14 are positioned coaxially, and closely adjacent with a separation D about equal to about half the thickness B of the resonator element.

It should be noted that while the regenerator element can be formed of ruby and operate in the presence of a strong (1K to 5K Gauss) magnetic field, it instead can be formed of iron sapphire which can operate with a lower intensity (e.g. 5 to 100 Gauss) magnetic field. An iron sapphire regenerator element may have a Q of about −10,000 at a temperature of 10° K. so more care must be taken to avoid degradation of the Q by the structure in the vicinity of the regenerator and resonator elements.

The pump and regeneration frequencies of solid state masers depend on inherent properties of the (e.g.) chromium or iron ions which they contain, and also on the value of any applied (d.c.) magnetic field. (This is to be distinguished from the magnetic component of the oscillating microwave fields which couple the resonator and regenerator). Generally, for effective maser action, the pump frequency must be more than twice that of the resonator frequency. In order to obtain this condition for chromium ions for a regeneration frequency of 10 GHz, an applied magnetic field of approximately 5000 Gauss is required. The two frequencies can be adjusted by varying the magnitude and orientation of this field. Iron ions have a somewhat different character, allowing maser regeneration at 12 GHz without large magnetic fields. However, a small magnetic field ($\approx 100$ Gauss) is needed for fine tuning.

In order to operate the resonator element at a high Q, at least 5 to 10 waves at the pump frequency must extend around the element. In the above-described oscillator, with a diameter of about 5 cm and a pump frequency of about 31 GHz, the wavelength at the pump frequency can extend about 30 wavelengths around the perimeter of the regenerator element. The regenerator element is not resonant at the signal frequency (10 GHz), or at least has a very low Q at the signal frequency. As the sapphire resonator element resonates slightly, at the signal frequency, this resonance is coupled to the ruby or other maser material which regenerates it.

The elements 12,14 can be supported by a dielectric support 40. To maintain a cryogenic temperature, a cold box 42 is maintained around the elements and a cold "finger" 43 extends into the box. The cold box may be formed of copper, which is of course electrically conductive, but the elements are spaced at least about 1 cm away from the walls of the cold box, so that the amount of reduction of the postive Q is only small. The particular feed line 18 is a waveguide with a short-circuited end 44, and a coupling 46 formed by a wire extending between the shorted end 44 and a point 50 lying ¼ wavelength therefrom, the wire 46 extending close to the ring portion 34 of the regenerator elemement to couple microwaves thereto. The output line 22 is a coaxial cable with the outer conductor shorted at the end 52, and a conductor 54 extending between the inner conductor 56 of the cable and the shorted end 52.

Figures 2, 3:
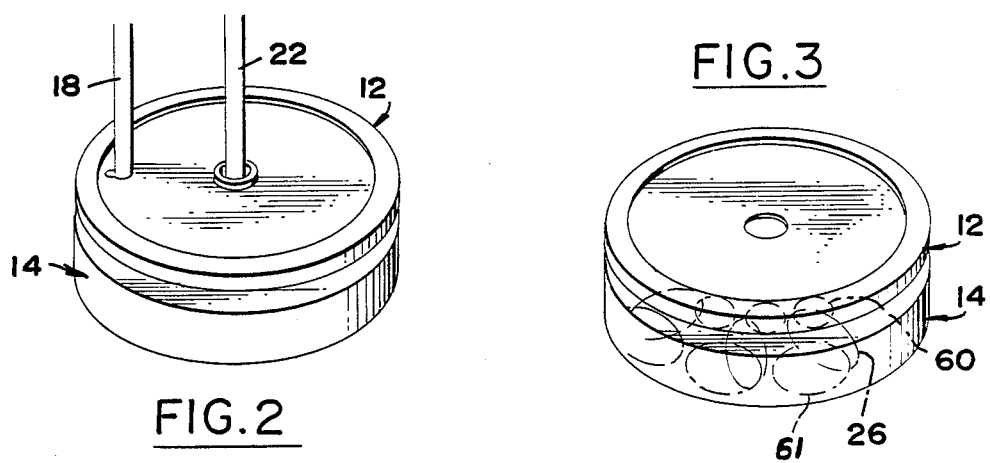
FIG. 2 is a partial perspective view of the oscillator of FIG. 1.
FIG. 3 is a partial perspective view indicating the manner of operation of the oscillator of FIG. 1.

FIG. 3 illustrates the closed-loop microwave electrical fields 61 within the resonator element 14. These electrical fields produce perpendicular fringing microwave magnetic fields 26 which extend outside the resonator element and through the regenerator element 14 to couple the elements. The figure also shows electrical fields 60 in the regenerator element.

Figure 4:
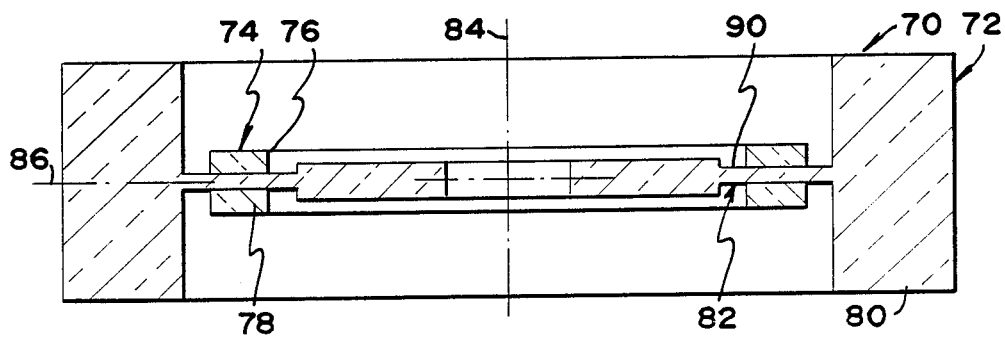
FIG. 4 is a partial sectional view of an oscillator constructed in accordance with another embodiment of the invention.

FIG. 4 illustrates another oscillator 70 which includes a resonator element 72 similar to that of FIG. 1, and a regenerator element 74 which is in the form of two ring-shaped subelements 76,78. The resonator element 72 includes a ring portion 80 of rectangular cross section and a disc portion 82 extending radially inwardly from the ring portion towards the axis 84 of the resonator. The subelements 76,78 of the regenerator are mounted at opposite faces of the disc portion 82 of the resonator, concentric with the axis 84. This arrangement is gravitationally insensitive because of the symmetry of the element combination about the axis 84 and an imaginary plane 86 extending perpendicular to the axis 84. In addition, this arrangement simplifies mounting and assures a constant relative position of the two elements. It may be noted that in the resonator 72, only the ring portion 80 resonates, the disc portion 82 serving only to facilitate mounting. The disc portion 82 has a thin part 90 on which the two subelements 76, 78 are mounted to enable the subelements to lie close to one another and act as a single element in resonating.

It may be noted that applicant's arrangement wherein the resonator element is substantially devoid of contact with electrically conductive material, results in the entire resonator being constructed of sapphire. Only relatively small sapphire elements, of a size of perhaps 5 cm in diameter, are available at reasonable cost, and the oscillator operates at a relatively high microwave frequency. However, by enabling an increase in temperature at which the resonator and regenerator elements are kept, from about 1.5° K. to perhaps 10° K. to 40° K, the cost and size of the refrigeration apparatus is greatly reduced.

The dopant density (the density of Chromium or Iron ions in the sapphire matrix) used in solid state masers is typically 0.05% to 0.1%. Both the regenerative capability of the material (the magnitude of the inverse of its negative Q) and the microwave pump power required for operation, are proportional to this density. They are both dependent on the temperature as well. The tendency is toward weaker regeneration and higher power as temperature is raised. Practical high temperature operation requires that the power be kept to a practical low enough level (achieved by reduced dopant density) while regeneration is sufficient to cause oscillation (achieved by increased dopant density). The absence of metallic conduction losses in the regenerator will allow oscillation to occur with only a small dopant density. This makes higher temperature operation more practical than would be possible with a regenerator with metallic parts.

The required power also depends on temperature through the ion spin relaxation time, which is strongly material dependent, and is proportional to the maser (regenerator) volume. The spin relaxation time for all maser materials becomes rapidly shorter as the temperature is raised, causing a proportionate increase in the required power. Experimental studies show the spin relaxation time can be made to decrease by the use of a low value of dopant density. Decreased dopant density, then, reduces the required pump power in two ways: (1) the power is directly proportional to the dopant desity; and (2) the power is also inversely proportional to the spin relaxation time which increases as the density is reduced.

For a given configuration and maser material, an upper limit on the temperature of operation occurs when the required power becmes larger than is practical for small-scale refrigeration units at that temperature. A different high temperature limit occurs when, as the negative Q of the regenerator increases in magnitude, oscillation can no longer be supported since it becomes larger than the product of the resonator Q and the coupling factor previously discussed. Design of the oscillator involves balancing these factors (dopant density, material selection, regenerator volume, and coupling constant) to the requirement of operating temperature and allowed pump power.

Previous maser material has used dopant densities (chromium or iron) of considerably more than 0.01%, and generally 0.05% to 0.10%. By using a dopant level of no more than about 0.01% (by weight), or less, applicant is able to operate the oscillator at a higher temperature with less pump power than would be required at a higher dopant level. The lower dopant density results in the need for greater coupling of the elements, by placing them close together (possibly in direct contact), and the great need to avoid electrically conductive material adjacent to the elements which would raise the absolute value of the effective regenerator Q and decrease the effective resonator Q. However, the lower dopant density allows less pump power (and the resultant heating) to be applied to the regenerator element and still cause oscillation. For example, at 1°K. and a ruby material with 0.05% dopant, about 10 microwatts of power might be applied; at 10° K. and the same material, about 10 miliwatts would be required; at 10° K. and ruby material with 0.01% dopant, about 100 microwatts would be required.

Thus, the invention provides a very low noise microwave (or even millimeter wave) oscillator which can operate at higher temperatures than required in the prior art of very low noise microwave oscillators. The resonator element can be formed of sapphire, with substantially no contact with electrically conductive material, and can be closely coupled to a regenerator by placing them adjacent so that the regenerator element lies directly in the magnetic fringe field of the resonator element. The regenerator element can be formed as a pair of subelements lying on opposite sides of a disc portion of a resonator element, the two elements lying concentric, to provide gravitational symmetry.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. In a low noise oscillator which includes a regenerator element of maser material which is resonant at a predetermined pump frequency, means for applying electromagnetic energy at said pump frequency to said regenerator element, a resonator element coupled to said regenerator element so that a magnetic field of a predetermined signal frequency produced by one element is coupled to the other element, said resonator element being resonant to said signal frequency which is different from said pump frequency, and means for maintaining said elements at a low temperature which is below room temperature; the improvement wherein:

said resonator element comprises a ring portion formed of dielectric material comprising primarily saphire and being substantially devoid of contact with electrically conductive material, whereby to avoid Q-lowering losses from nonsuperconducting metals while enabling operation at temperature above those required to maintain a metal at a low superconducting temperature.

2. The improvement described in claim 1 wherein:
said regenerator element lies directly in the magnetic fringe field at said signal frequency produced by said resonator element, whereby to avoid the need for a coaxial or waveguide coupling between said elements.

3. The improvement described in claim 2 wherein:
said regenerator element comprises a ring of dielectric material, and is substantially devoid of contact with electrically conductive material.

4. The improvement described in claim 1 wherein:

said resonator element includes a disc portion thinner than said ring portion and extending radially inwardly from said ring portion;

said regenerator element includes a pair of rings lying on opposite faces of said disc portion of said resonator element.

5. The improvement described in claim 1 wherein:

said regenerator element includes sapphire with a dopant selected from the group consisting of chromium and iron, wherein the amount of dopant is no more than about 0.01%.

6. A low noise oscillator comprising:

a regenerator element of maser material which is resonant at a predetermined pump frequency;

a resonator element of dielectric material which is resonant at a predetermined signal frequency that is different from said pump frequency; and means for applying energy at said pump frequency to said regenerator element, and means for receiving energy at said signal frequency from said resonator element;

said regenerator and resonator elements each having a ring-shaped portion lying about an axis;

said ring-shaped portions lying substantially coaxial and close enough along said axes that enough of the material of said regenerator element lies directly in an intense enough region of the magnetic fringe field at said signal frequency created by said resonator element, that said resonator element oscillates to produce an output at said signal frequency in said means for receiving energy, without the need for a conductive signal-carrying line coupling said elements.

7. The oscillator described in claim 6 wherein:

said resonator element comprises primarily saphire and is substantially devoid of contact with electrically conductive material.

8. A low noise oscillator comprising:

a largely ring-shaped regenerator element formed primarily of a crystal of aluminum oxide and concentric to a regenerator axis, said regenerator element being resonant to a predetermined pump frequency but not to a predetermined signal frequency;

a largely ring-shaped resonator element formed primarily of a crystal of aluminum oxide and concentric to a resonator axis, and resonant to said signal frequency;

means for holding said elements adjacent and coaxial so each element lies directly in the magnetic fringe field of the other element;

means for applying electromagnetic energy of said pump frequency to said regenerator element and for receiving electromagnetic energy of said signal frequency from said resonator;

said elements each being substantially devoid of contact with electrically conductive material.

9. The oscillator described in claim 8 wherein:

said resonator element includes a ring portion and a disc portion thinner along said resonator axis than said ring portion, said disc portion lying radially within said ring portion;

said regenerator element includes two ring-shaped portions lying on axially opposite sides of said disc portion of said regenerator element.

10. A low noise oscillator comprising:

a regenerator element of dielectric maser material, which is resonant at a predetermined pump frequency;

a resonator element of dielectric material which is resonant at a predetermined signal frequency that is different from said pump frequency;

means for applying energy at said pump frequency to said regenerator element, and means for receiving energy at said signal frequency from said resonator element;

said elements being close enough that enough of the material of said regenerator element lies directly in an intense enough region of the magnetic fringe field at said signal frequency created by said resonator element, that said resonator element oscillates to produce an output at said signal frequency in said means for receiving energy;

said regenerator element comprising sapphire containing a dopant chosen from the group consisting of chromium and iron, the density of said dopant being no more than about 0.01% of the sapphire material, whereby to decrease the required energy at said pump frequency.

11. The oscillator described in claim 10 including :

means for maintaining said elements at a temperature of at least 10° K., said elements being sufficiently free of adjacency to electrically conductive material, and said energy at said pump frequency being sufficient to cause oscillation of said resonator element that produces an output signal on said means for receiving energy at said signal frequency.

* * * * *